(12) United States Patent
Furuta et al.

(10) Patent No.: US 7,819,300 B2
(45) Date of Patent: Oct. 26, 2010

(54) PASTE TRANSFER DEVICE AND ELECTRONIC COMPONENT MOUNTING APPARATUS

(75) Inventors: Noboru Furuta, Fukuoka (JP); Yuzuru Inaba, Fukuoka (JP); Akira Kabeshita, Saga (JP)

(73) Assignee: Panasonic Corporation, Osaka (JP)

( * ) Notice: Subject to any disclaimer, the term of this patent is extended or adjusted under 35 U.S.C. 154(b) by 271 days.

(21) Appl. No.: 12/282,527

(22) PCT Filed: Mar. 12, 2007

(86) PCT No.: PCT/JP2007/054827

§ 371 (c)(1),
(2), (4) Date: Sep. 11, 2008

(87) PCT Pub. No.: WO2007/105687

PCT Pub. Date: Sep. 20, 2007

(65) Prior Publication Data

US 2009/0159216 A1 Jun. 25, 2009

(30) Foreign Application Priority Data

Mar. 15, 2006 (JP) ............................. 2006-070616

(51) Int. Cl.
*B23K 3/00* (2006.01)

(52) U.S. Cl. .......................... 228/22; 118/120; 118/304; 118/413

(58) Field of Classification Search .................... 228/22; 118/120, 304, 413
See application file for complete search history.

(56) References Cited

U.S. PATENT DOCUMENTS 6,581,282 B2  6/2003  Mori et al.

FOREIGN PATENT DOCUMENTS

| JP | 2000-022394 | 1/2000 |
|---|---|---|
| JP | 2000-188498 | 7/2000 |

(Continued)

OTHER PUBLICATIONS

International Preliminary Report on Patentability and Written Opinion of the International Searching Authority, issued Sep. 16, 2008 in the International (PCT) Application of which the present application is the U.S. National Stage.

(Continued)

*Primary Examiner*—Kevin P Kerns
*Assistant Examiner*—Nicholas P D'Aniello
(74) *Attorney, Agent, or Firm*—Wenderoth, Lind & Ponack, LLP.

(57) ABSTRACT

In a flux transfer unit to be used in an electronic component mounting apparatus for transferring flux to an electronic component picked up from a component feed unit and then mounting the electronic component onto a board, a blade holding head which has a first blade and a second blade for film formation use and scraping use of flux, respectively, and which is reciprocatively driven by a rodless cylinder via a drive transmission pin, is held by a movable member so as to be swingable about a swing support pin, and the movable member is braked with a specified braking force by a plate spring member. Thus, each time the direction of motion of the blade is reversed, the blade holding head swings, so that the first blade and the second blade can be automatically switched over without providing any exclusive drive mechanism.

6 Claims, 13 Drawing Sheets

FOREIGN PATENT DOCUMENTS

| | | |
|---|---|---|
| JP | 2003-023036 | 1/2003 |
| JP | 2004-330261 | 11/2004 |
| WO | 2004/100629 | 11/2004 |

OTHER PUBLICATIONS

International Search Report issued Apr. 17, 2007 in the International (PCT) Application of which the present application is the U.S. National Stage.

PASTE TRANSFER DEVICE AND ELECTRONIC COMPONENT MOUNTING APPARATUS

TECHNICAL FIELD

The present invention relates to a paste transfer device for applying paste to electronic components by transfer, as well as to an electronic component mounting apparatus for mounting electronic components, to which paste has been transferred by such a paste transfer device, onto a board.

BACKGROUND ART

The mounting of electronic components onto a board, in some cases, involves applying a pasty bonding auxiliary material such as flux and solder paste, or bonding material, by transfer onto a bonding surface between the electronic components and the board. This paste transfer (application) is carried out in various ways. For example, in a case of flux application, a widely used method is that electronic components picked up from a component feed unit are moved down to a table having flux formed thereon at a predetermined film thickness so that the flux is brought into contact with lower faces of the electronic components to fulfill the transfer. A conventionally known electronic component mounting apparatus to be used for such purposes is one including a flux transfer device in which a flux film is formed at a specified film thickness (see, e.g., Patent Documents 1 and 2).

In the case of Patent Document 1, two blades for scraping use and film formation use, respectively, are reciprocated on a flat transfer stage to alternately repeat a film formation operation, which is for preparing a flux film of a specified film pressure, and a scraping operation, which is for scraping and collecting the flux film that has been used for transfer and application by making electronic components brought into contact with the flux film so that its surface has been roughened. In the case of Patent Document 2, a flux film is formed on an outer circumferential surface of a rotating roller.

Patent document 1: JP 2000-188498 A
Patent document 2: JP 2000-22394 A

DISCLOSURE OF INVENTION

Problems to be Solved by the Invention

However, the above-described related-art examples have the following issues in achieving a higher-efficiency, more compact electronic component mounting apparatus. First, in the related art shown in Patent Document 1, there is a need for providing a reciprocating mechanism for reciprocating the two blades along the transfer stage and, moreover, a blade switching mechanism for switching between the two blades for film formation use and scraping use. For this reason, it becomes difficult to simplify the flux transfer device in terms of its mechanism, causing an obstacle to layout optimization for implementation of a compact component mounting apparatus. Particular for electronic component mounting apparatuses, there has been a demand for making the flux transfer device more compact not only in its planar installation area but also in its heightwise direction in consideration of passage of the mounting heads or the like above the flux transfer device.

Also, the related art shown in Patent Document 2, although being compatible by adopting the roller system, yet has such drawbacks as difficulty in controlling the film thickness as well as unsuitableness for use in achieving both flux application and bump leveling with bump-added electronic components because no flat transfer surface is provided. Thus, in the conventional related art examples, there is an issue of difficulty in achieving the transfer of flux or other paste with high accuracy by a compact device.

Accordingly, an object of the present invention, lying in solving the above-described issues, is to provide a paste transfer device as well as an electronic component mounting apparatus capable of achieving the transfer of flux or other paste with high accuracy by a compact device.

Means for Solving the Subject

In accomplishing the above object, the present invention has the following constitution.

According to a first aspect of the present invention, there is provided a paste transfer device for transferring paste to an electronic component, comprising:

a base member having a smooth film-formation surface on a top face thereof on which a paste film to be put into contact with the electronic component is formed;

a movable member for moving horizontally along the base member;

a blade holder which is coupled to the movable member so as to be swingable about a swinging fulcrum, for reciprocating along with the movable member;

a first blade and a second blade which are provided in the blade holder so as to be spaced from each other along a direction of the reciprocative motion so that a position of the swinging fulcrum in the direction of the reciprocative motion is placed therebetween;

a reciprocating mechanism for transmitting reciprocative driving force on a point of driving action where is given by a position in the blade holder distant from the swinging fulcrum; and a braking mechanism for braking the movable member toward a direction opposite to a direction of drive by the reciprocating mechanism with a braking resistance which overcomes a swinging resistance in a swinging of the blade holder, wherein either one of the first blade and the second blade is moved while being kept in contact with the base member during a forward motion of the movable member, and the other blade is moved while being kept in contact with the base member during a backward motion of the movable member.

According to a second aspect of the present invention, there is provided the paste transfer device as defined in the first aspect, wherein the first blade is a film-formation use blade for forming a paste film having a predetermined film thickness on the film-formation surface, and the second blade is a scraping use blade for scraping paste present on the film-formation surface.

According to a third aspect of the present invention, there is provided the paste transfer device as defined in the second aspect, wherein a cutout portion having a depth corresponding to the film thickness is provided at a contact portion of the film-forming use blade with the base member, and the scraping use blade is formed so as to make contact with the film-formation surface of the base member.

According to a fourth aspect of the present invention, there is provided the paste transfer device as defined in the second aspect, wherein a recessed portion whose bottom face functions as the film-formation surface and which has a depth corresponding to the film thickness is provided on the top face of the base member, and the scraping use blade is formed so as to make contact with the bottom face of the recessed portion.

According to a fifth aspect of the present invention, there is provided the paste transfer device as defined in the first aspect, wherein a paste storage portion for storing therein paste scraped off from the film-formation surface is provided between the first blade and the second blade.

According to a sixth aspect of the present invention, there is provided an electronic component mounting apparatus comprising:

a mounting head for holding and mounting the electronic component onto a board;

a board holding unit for holding the board;

a head moving device for moving and positioning the mounting head relative to the board holding unit; and the paste transfer device, as defined in any one of the first to fifth aspects, which is placed on a moving path of the mounting head to be moved by the head moving device, and which transfers paste to the electronic component held by the mounting head.

Effects of the Invention

According to the present invention, in an apparatus in which film formation operation and scraping operation of paste are performed alternately by two blades, the apparatus adopts a method that switching between the blades is executed by using driving force of the reciprocating mechanism for horizontally moving the blades. Thus, with a compact device, high-accuracy application of flux or other paste by transfer can be achieved without requiring such a blade switching mechanism having a separately provided driving source as those used in the related art.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Figure 1:
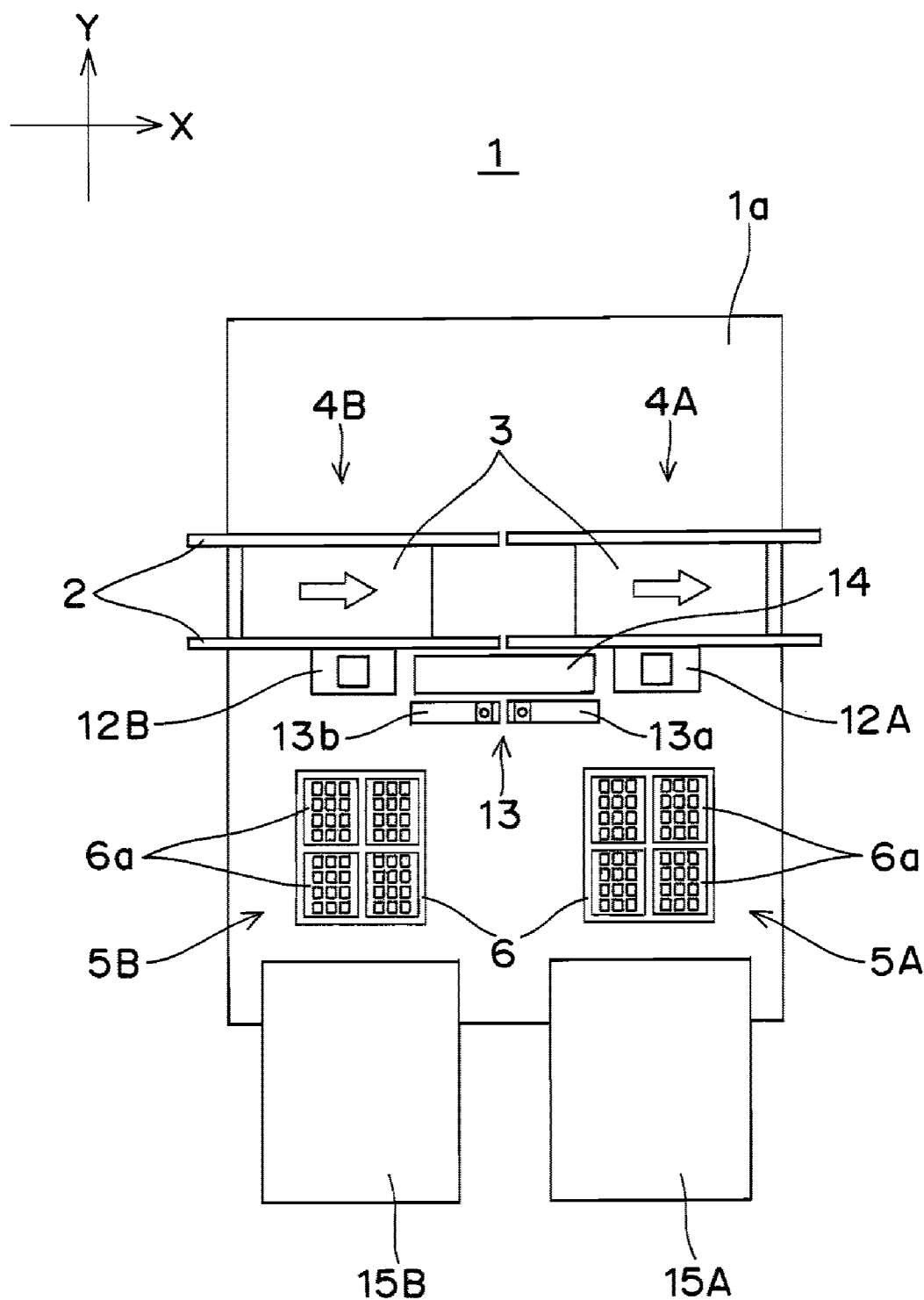
FIG. 1 is a plan view of an electronic component mounting apparatus according to an embodiment of the present invention.

Before the description of the present invention proceeds, it is to be noted that like parts are designated by like reference numerals throughout the accompanying drawings.

Hereinbelow, an embodiment of the present invention will be described in detail with reference to the accompanying drawings.

First, a construction of an electronic component mounting apparatus 1 according to one embodiment of the invention shown in FIG. 1 is explained with reference to a schematic plan view and a schematic perspective view of the electronic component mounting apparatus 1. Referring to FIG. 1, a conveyance path 2 is provided on a top surface of a base 1a along an X direction (board conveyance direction) The conveyance path 2 serves for conveying a board 3 conveyed in from the upstream side and for holding and positioning the board 3 to a mounting position for mounting by a component mounting mechanism, which is described below. Accordingly, the conveyance path 2 serves as a board holding unit for holding and positioning the board 3. The electronic component mounting apparatus 1 is provided with two component mounting mechanisms 4A, 4B of an identical structure, so that electronic components are mounted onto boards 3 held at their respective mounting positions in the conveyance path 2 by the component mounting mechanisms 4A, 4B.

Figure 2:
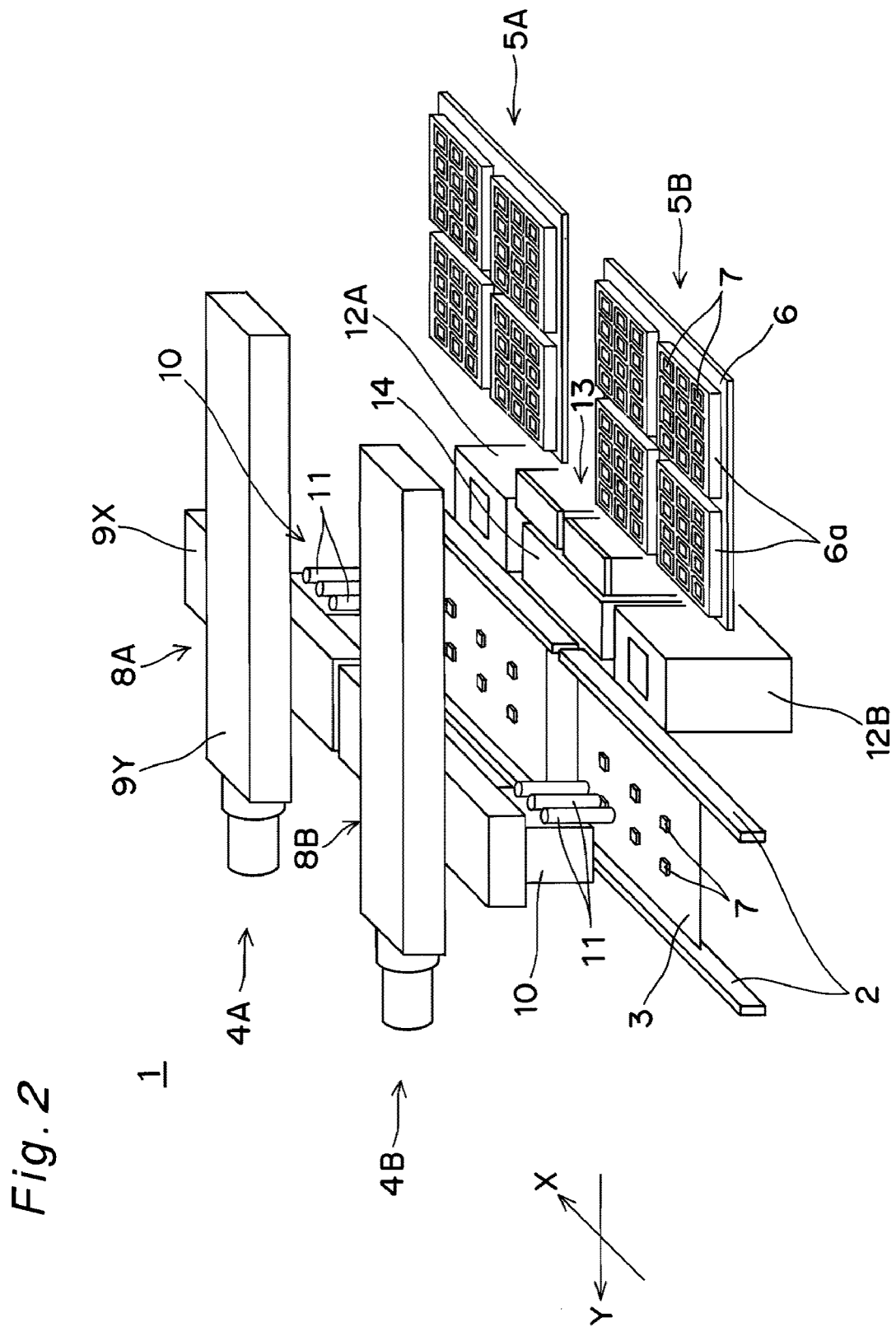
FIG. 2 is a perspective view of the electronic component mounting apparatus of the embodiment.

As shown in FIG. 2, the component mounting mechanisms 4A, 4B include component feed units 5A, 5B, respectively, and pallets 6 on each of which a plurality of component trays 6a having a plurality of electronic components 7 housed therein in a grid array are set are held on the component feed units 5A, 5B, respectively. The pallets 6 with the component trays 6a set thereon, respectively, are fed to the component feed units 5A, 5B by tray feeders 15A, 15B, respectively. The empty component trays 6a from which the electronic components 7 have been picked up are collected to the tray feeders 15A, 15B along with the pallets 6.

Above the base 1a, X-Y robots 8A, 8B are provided with the conveyance path 2 and the component feed units 5A, 5B included in their moving ranges, respectively. Each of the X-Y robots 8A, 8B has a structure that an X-axis table 9X and a Y-axis table 9Y are combined so as to perpendicularly cross each other, where mounting heads 10 each having a plurality of suction nozzle units 11 are fitted to the X-axis table 9X. Driving the X-Y robots 8A, 8B causes the mounting heads 10 to be horizontally moved in the X and Y directions.

Therefore, the X-Y robots 8A, 8B serve as head moving device for moving the mounting heads 10 between the component feed units 5A, 5B and the board holding unit provided on the conveyance path 2. Through this motion, the mounting heads 10 pick up the electronic components 7 from the component feed units 5A, 5B by suction nozzles 11a (see FIG. 11A or 11B) set on the suction nozzle units 11, and mount the electronic components 7 onto the board 3 held on the conveyance path 2.

On a moving path along which the mounting heads 10 that have picked up the electronic components 7 from the component feed units 5A, 5B move to the board 3 are provided recognition units 12A, 12B and a flux transfer unit 13 which is an example of the paste transfer device. Each of the recognition units 12A, 12B, including a line camera, picks up an image of electronic components 7 held by the mounting heads 10 from below through a scan operation in which the mounting heads 10 having the electronic components 7 held on the individual suction nozzle units 11 are moved in a specified direction above the recognition units 12A, 12B. Then, the picked-up images are subjected to a recognition process to do recognition of the electronic components 7 picked up from the component feed units 5A, 5B, i.e., identification or detection of any displacement as to the electronic components 7.

At a position between the two recognition units 12A, 12B, the flux transfer unit 13 is placed. The flux transfer unit 13 has a function of applying flux, which is for use of solder bonding and an example of the paste, by transfer to bumps 7a (see FIG. 11A or 11B) of the electronic components 7 picked up from the component feed units 5A, 5B. The flux transfer unit 13 includes transfer tables 13a, 13b for forming a flux coating film that serves for transfer, as well as a blade reciprocating mechanism 14 for driving a blade (or squeegee) that serves for film formation.

The transfer tables 13a, 13b are placed in series along the X direction so that the two mounting heads 10 to be moved by the X-Y robots 8A, 8B, respectively, are enabled to access the transfer tables 13a, 13b without interference thereto. The blade reciprocating mechanism 14 is so constructed that drive mechanisms for moving blades on these transfer tables 13a, 13b, respectively, are integrally incorporated thereinto. That is, the flux transfer unit 13 has a function as a paste transfer device which is provided on the moving path of the mounting heads 10 by the head moving means and by which flux as paste is applied by transfer (i.e., by contact) to the electronic components 7 held by the suction nozzles 11a serving as component holding parts provided in the mounting heads 10.

Figure 3A:
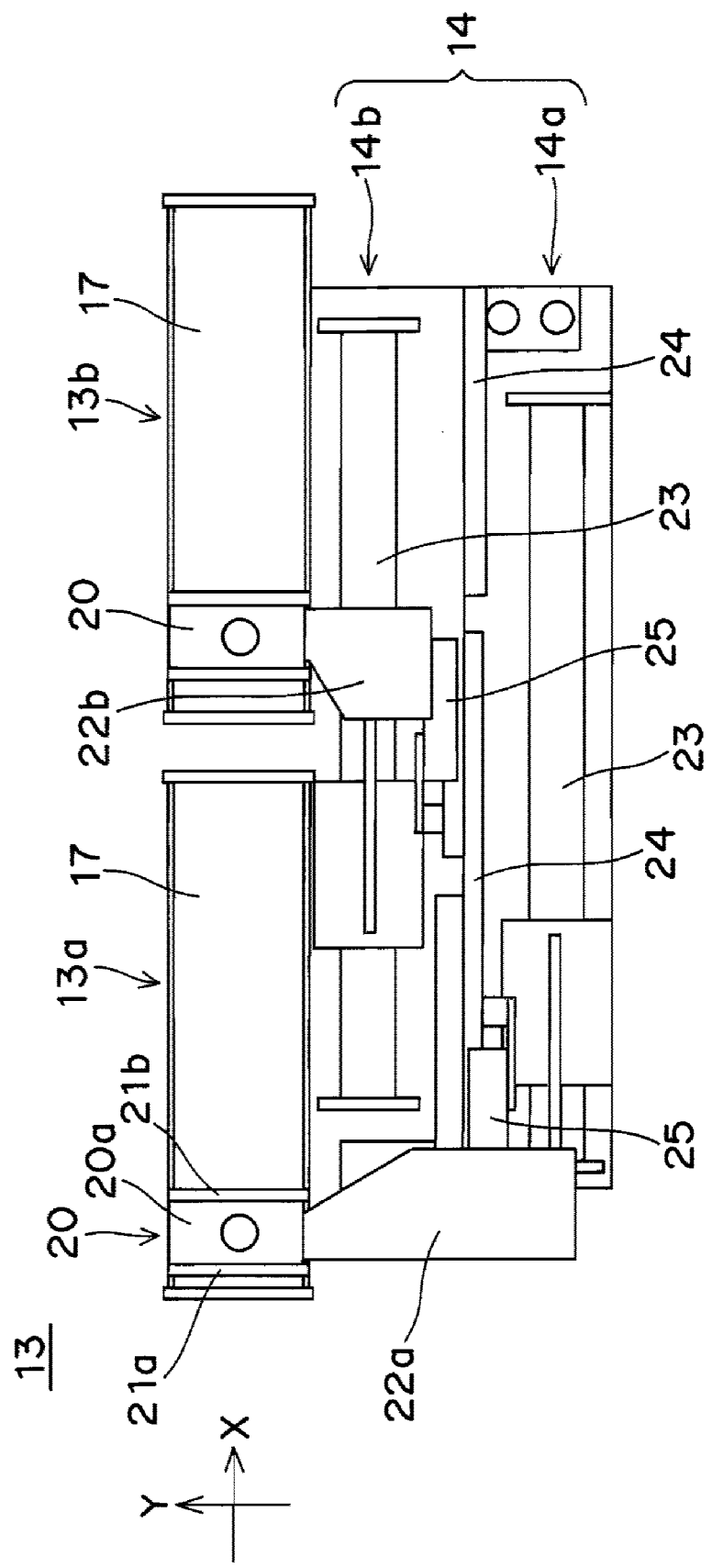
FIG. 3A is a schematic plan view showing a construction of a flux transfer unit in the electronic component mounting apparatus of the embodiment.
Figure 3B:
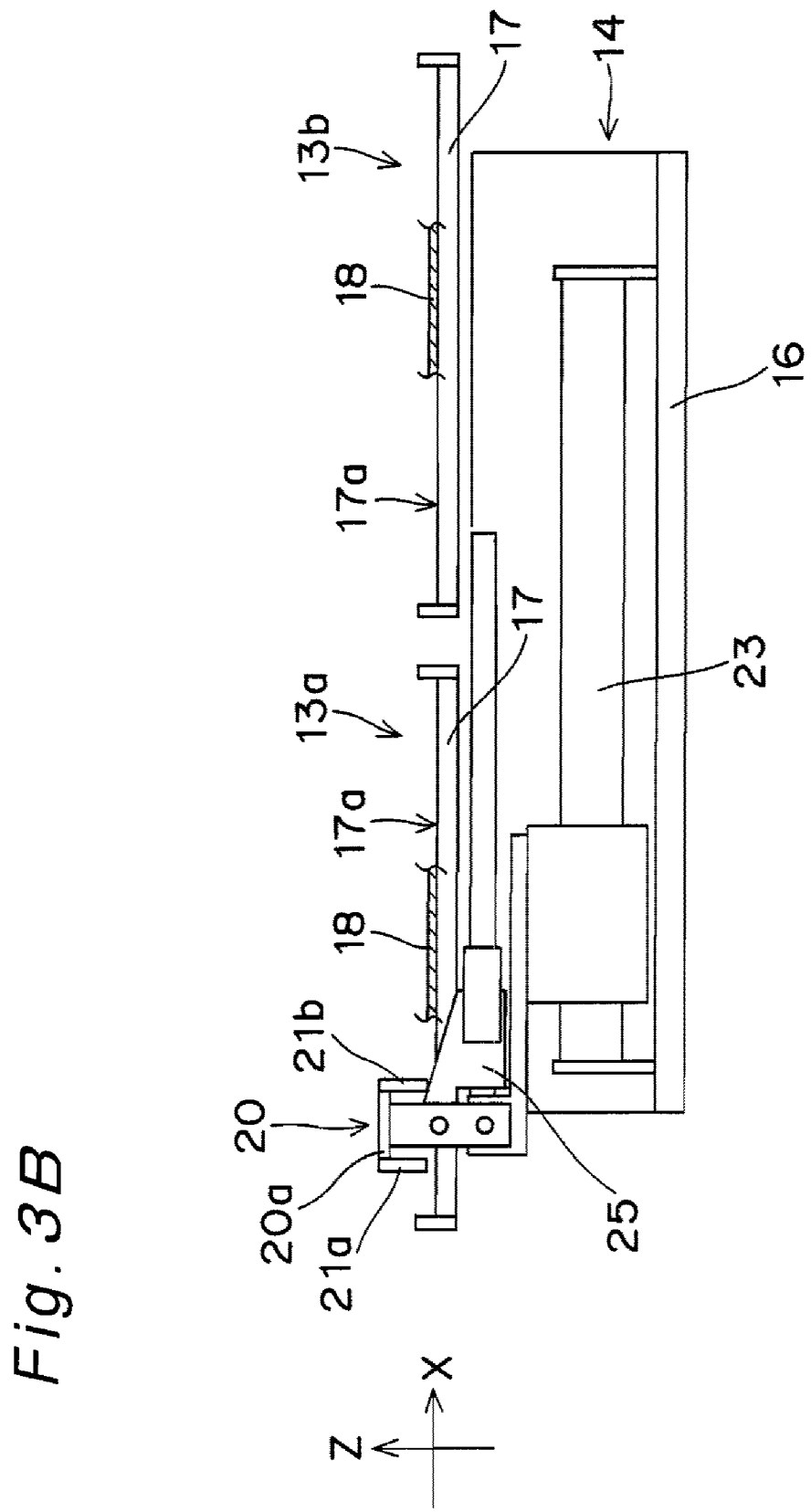
FIG. 3B is a schematic side view of the electronic component mounting apparatus of FIG. 3A.

In this connection, FIG. 3A shows a schematic plan view of the flux transfer unit 13, and FIG. 3B shows a schematic side view thereof. As shown in FIGS. 3A and 3B, the flux transfer unit 13 is so constructed that the transfer tables 13a, 13b, each of which has, as a main member thereof, a base member 17 having, on its top, a smooth film-formation surface 17a for formation of a coating film of flux 18, are placed in series along the X direction, while the blade reciprocating mechanism 14 is placed along the transfer tables 13a, 13b. Above the transfer tables 13a, 13b, blade holding heads 20 are placed while being held by brackets 22a, 22b extending out from the blade reciprocating mechanism 14. The blade holding heads 20 are so constructed that a first blade 21a and a second blade 21b, both being plate-shaped, are held vertically at both end portions of a horizontal holder 20a with their contact end portions directed downward. It is noted that in the side view, the blade holding head 20 placed in the transfer table 13b is not shown.

The blade reciprocating mechanism 14 include a first drive mechanism 14a and a second drive mechanism 14b which are placed in parallel along the Y direction and which serve for horizontally reciprocating the brackets 22a, 22b with the blade holding head 20 held thereon in the X direction independently of each other. Drive sources for the first drive mechanism 14a and the second drive mechanism 14b are rodless cylinders 23, respectively, provided on the top of a horizontal base frame 16. Then, horizontal motions of the brackets 22a, 22b by the rodless cylinders 23 are guided by guide rails 24 via movable members 25, respectively.

The first drive mechanism 14a and the second drive mechanism 14b are inevitably slender-shaped from the mechanical-purpose viewpoint of moving the blades on the slender-shaped transfer tables 13a, 13b. Then, in a case where the transfer tables 13a, 13b are placed in series as described above, series placement of the first drive mechanism 14a and the second drive mechanism 14b would result in an increase in their longitudinal occupational area, making an obstacle to implementation of a more compact device layout. In contrast to this, as shown in this embodiment, placing the first drive mechanism 14a and the second drive mechanism 14b in parallel to each other along the Y direction makes it possible reduce the occupational area of the flux transfer unit 13, allowing a more compact device to be implemented.

Figure 4:
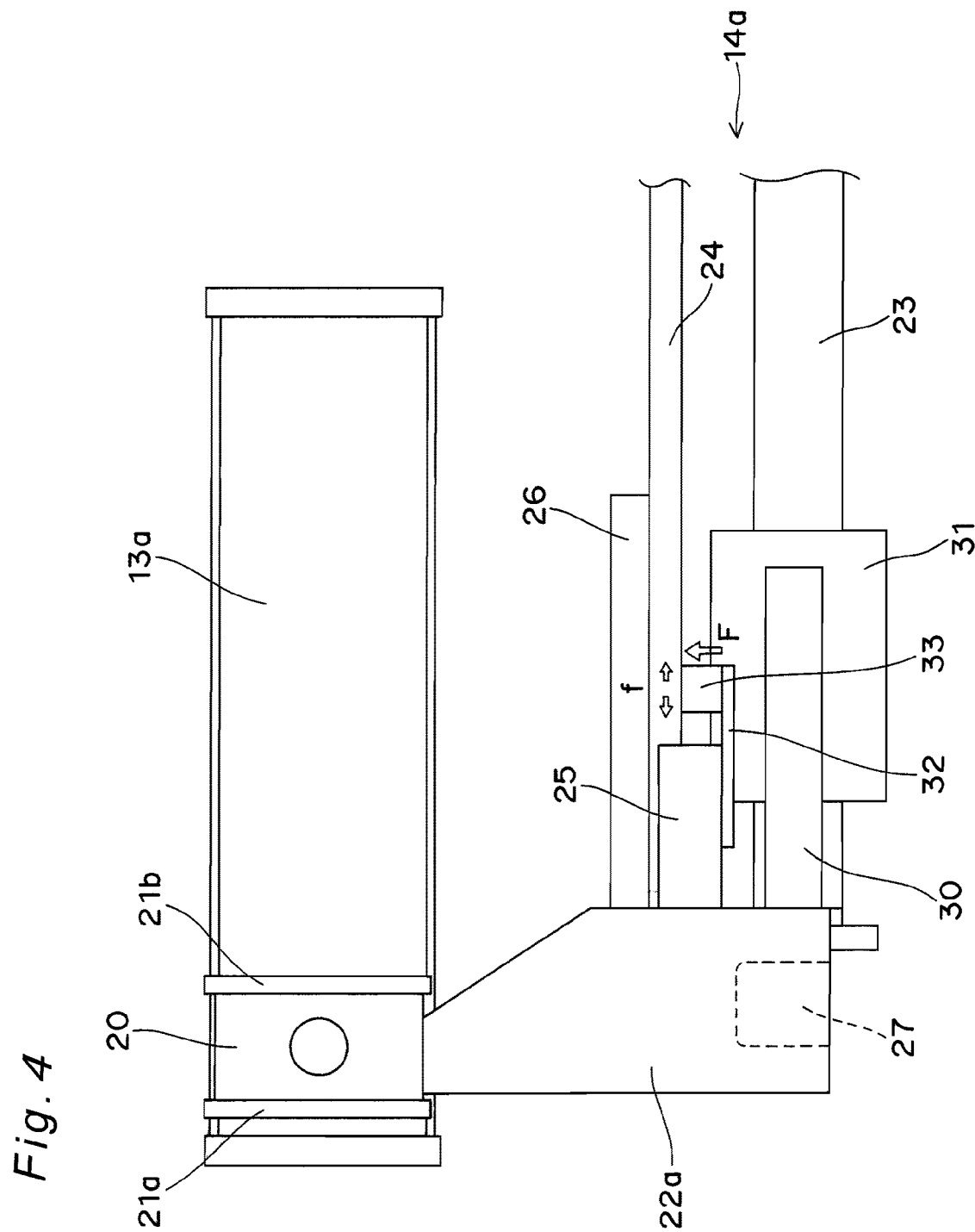
FIG. 4 is a partial plan view of the flux transfer unit in the electronic component mounting apparatus of the embodiment.
Figure 5:
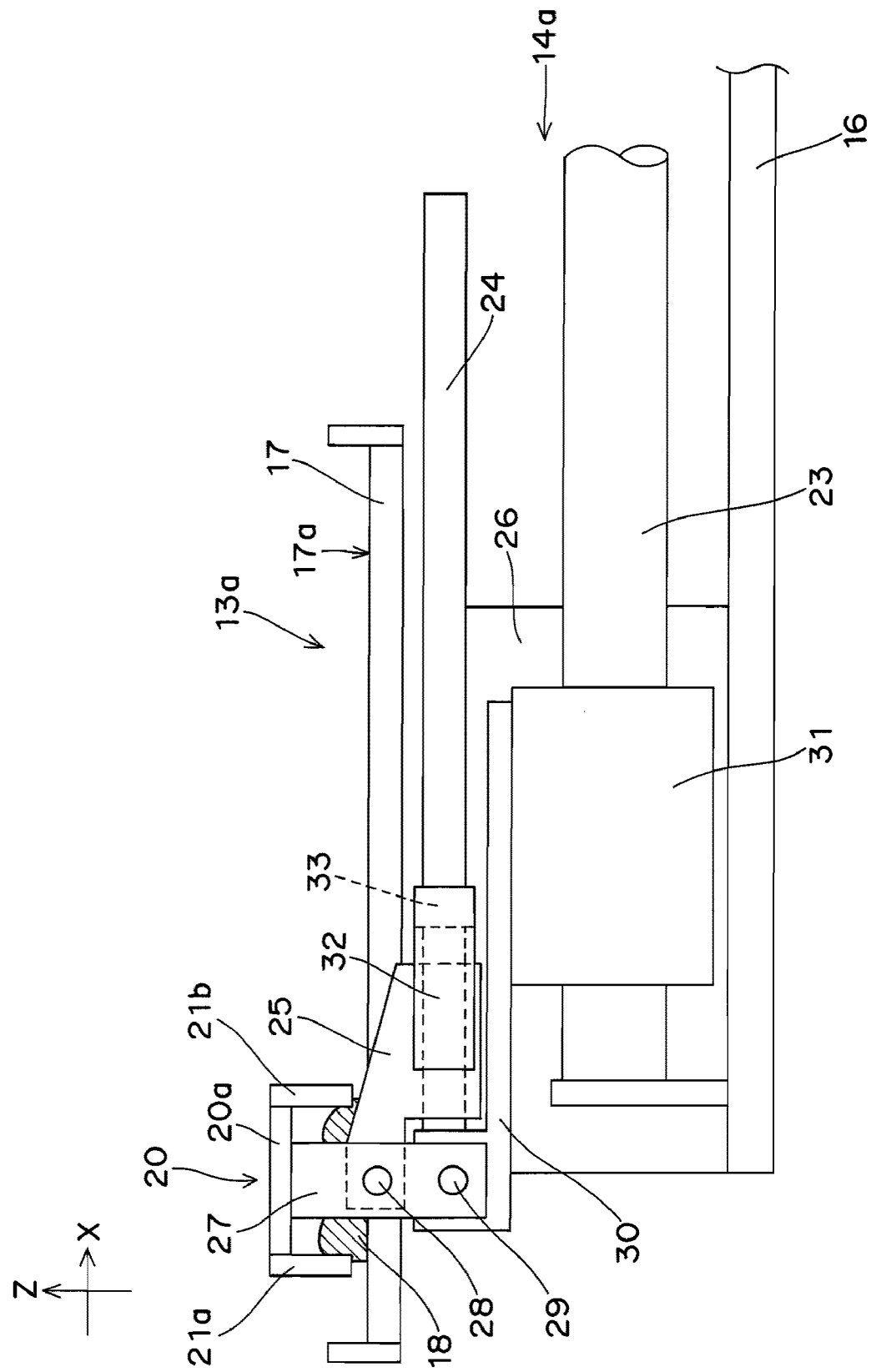
FIG. 5 is a partial side view of the flux transfer unit in the electronic component mounting apparatus of the embodiment.
Figure 6:
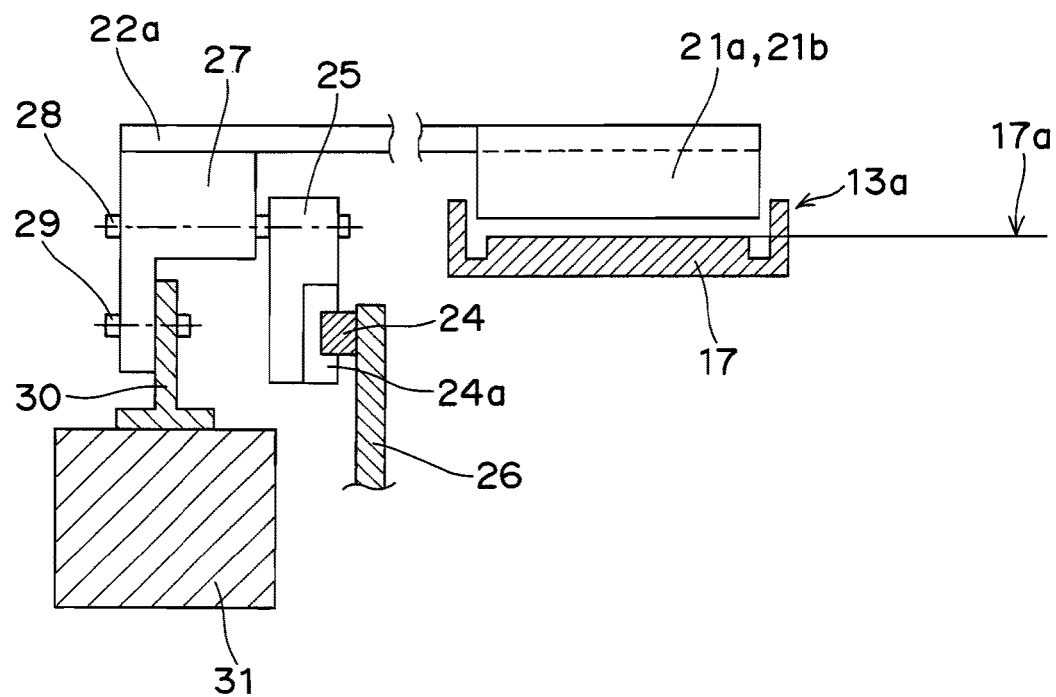
FIG. 6 is a partial sectional view of the flux transfer unit in the electronic component mounting apparatus of the embodiment.

Next, a detailed construction of the flux transfer unit 13 is explained with reference to FIG. 4 showing a partial plan view thereof, FIG. 5 showing a partial side view, and FIG. 6 showing a partial side view thereof. The transfer tables 13a, 13b, as well as the first drive mechanism 14a and the second drive mechanism 14b, although differing from each other in the shape of the brackets 22a, 22b included therein, respectively, are basically identical in construction to each other. Accordingly, the following description will be made only on the structure of the first drive mechanism 14a for driving the transfer table 13a and the blade holding head 20 that moves on the transfer table 13a.

Referring to FIGS. 4 and 5, a guide rail 24 is provided along the X direction on a side face of a vertical frame 26 erectly provided on the base plate 16. A slider 24a slidably fitted to the guide rail 24 is fixed to the movable member 25 (see FIG. 6), and the movable member 25 is provided so as to be horizontally movable along the X direction under the guide of the guide rail 24.

As shown in FIG. 5, the movable member 25 is so shaped that an upper portion of a left end portion thereof is extended out laterally on the left side, where at this extending portion, a swing link 27 is pivoted via a swing support pin 28 so as to be swingable within an X-Z plane. The swing link 27 is fixed to a lower face of the bracket 22a so that as the swing link 27 swings about the swing support pin 28 serving as a swinging fulcrum, the holder 20a coupled to the bracket 22a also swings integrally with the first blade 21a and the second blade 21b. Further, as the movable member 25 reciprocates in the X direction, the holder 20a reciprocates integrally with the first blade 21a and the second blade 21b.

Therefore, the holder 20a, the bracket 22a and the swing link 27 are coupled to the movable member 25 so as to be swingable about the swinging fulcrum, and constitute the blade holder that reciprocates along with the movable member 25. Then, the first blade 21a and the second blade 21b are fitted to the holder 20a of the blade holder so as to be spaced from each other in the reciprocative direction so that the swinging fulcrum is interposed therebetween, i.e., that the position of the swinging fulcrum in the reciprocative direction is interposed therebetween. In the operation for flux coating film formation by the flux transfer unit 13, flux 18 scraped from the film-formation surface 17a is stored in the space between the first blade 21a and the second blade 21b. It is noted that such a space serves as a flux storage portion (paste storage portion).

A drive transmission pin 29 is provided at a position in the swing link 27 downwardly away from the swing support pin 28. The drive transmission pin 29 couples the swing link 27 and a coupling member 30 to each other so as to allow their relative rotational displacement about an axis of the drive transmission pin 29. The coupling member 30 is coupled to a movable block 31 of the rodless cylinder 23 provided on the base plate 16 along the X direction. Driving the rodless cylinder 23 to slide the movable block 31 in the X direction causes an X-directional horizontal driving force to be transmitted to the swing link 27 via the coupling member 30 and the drive transmission pin 29. Accordingly, the rodless cylinder 23, the movable block 31 and the coupling member 30 constitute a reciprocating mechanism for transmitting reciprocation driving force to the blade holder on a point of driving action given by a position in the drive transmission pin 29 distant from the position of the swing support pin 28 that is the swinging fulcrum.

As shown in FIG. 4, a plate spring member 32 (which is an example of elastic member) made from spring steel or other like material is coupled to a side face of the movable member 25, and a sliding member 33 made of a resin or other elastic body is fitted to a tip end portion of the plate spring member 32. The sliding member 33 is in contact with the side face of the guide rail 24, in which fitted state the sliding member 33 is pressed against the guide rail 24 with a specified pressing force F by the elastic force of the plate spring member 32. This specified pressing force F causes a braking force f having a magnitude corresponding to the friction coefficient between the sliding member 33 and the guide rail 24 to act in the motion of the movable member 25 along the X direction.

In this case, such a construction is adopted that when the entire blade holding head 20 swings about the swing support pin 28, the braking force f due to the friction between the sliding member 33 and the guide rail 24 becomes larger than the swinging resistance. That is, setting the pressing force F exerted by the plate spring member 32, the material of the sliding member 33, and the surface properties of parts that make sliding contact with the guide rail 24 to proper ones as required allows a desired braking force f to be obtained. More specifically, the plate spring member 32 and the sliding member 33 work as a braking mechanism that brakes the movable member 25 toward a direction opposite to the direction of drive by the reciprocating mechanism with a braking resistance that overcomes the swinging resistance in the swinging of the blade holder. Then, as will be described later, this braking force f, acting toward the direction opposite to the driving direction, makes it possible to fulfill automatic switching between the first blade 21a and the second blade 21b during the flux coating film formation and flux scraping operation.

In addition, as shown in FIG. 5, the embodiment has been described on a mode in which the two blades 21a and 21b are set in the holder 20a so as to interpose the swinging fulcrum (swing support pin 28) therebetween, and in which the holder 20a is placed at a position upward of the swinging fulcrum as in the figure while the point of driving action is placed at a position downward of the swinging fulcrum as in the figure. However, this embodiment is not limited to such a mode only. Instead of such a case, for example, a mode in which the holder is placed at a position upward of the point of driving action while the swinging fulcrum is placed at a position upward of the holder may also be adopted. In addition, for the electronic component mounting apparatus 1, it is preferable that the flux transfer unit 13 be made even lower in unit height by considering that the mounting heads 10 pass over the flux transfer unit 13. Therefore, rather than the mode in which the swinging fulcrum is placed at a position upward of the holder, the mode in which the holder is placed at a position upward of the swinging fulcrum as in this embodiment allows the unit height to be even lower, hence being preferable.

Figure 7A:
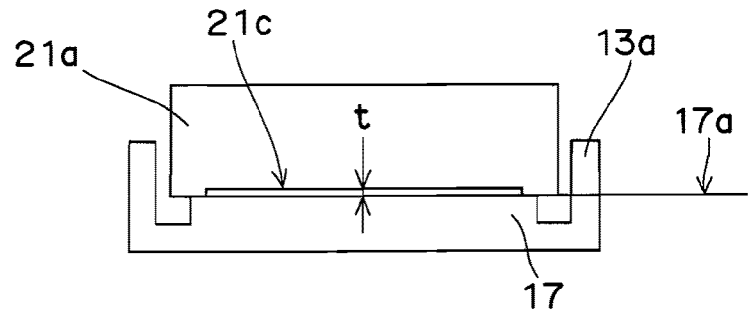
FIG. 7A is a configuration explanatory view of a film-formation use blade and a transfer table of the flux transfer unit in the electronic component mounting apparatus of the embodiment.
Figure 7B:
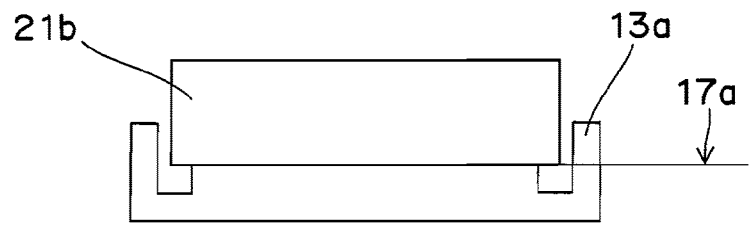
FIG. 7B is a configuration explanatory view of a scraping use blade and a transfer table of the flux transfer unit of the embodiment.

Here are described configurations of the base member 17, the first blade 21a and the second blade 21b with reference to FIGS. 7A and 7B. The first blade 21a is a film-formation use blade for forming a paste film having a specified film thickness on the film-formation surface 17a, and the second blade 21b is a scraping use blade for scraping paste present on the film-formation surface 17a.

As shown in FIGS. 7A and 7B, on the transfer table 13a is provided a base member 17 including a film-formation surface 17a having a smooth surface. In a lower end portion of the first blade 21a, at a contact end portion with the film-formation surface 17a is provided a cutout portion 21c corresponding to a specified flux film thickness t. By making the first blade 21a horizontally moved with the lower end portion of the first blade 21a kept in contact with the film-formation surface 17a, a coating film of the flux 18 having the film thickness t is formed on the film-formation surface 17a.

The second blade 21b has a flat lower end portion without any cutout. By making the second blade 21b horizontally moved with the whole surface of the lower end portion kept in contact with the film-formation surface 17a, i.e., with the lower end portion kept in contact therewith, the flux coating film present on the film-formation surface 17a can be scraped off. That is, in the example shown in this case, the cutout portion 21c having a depth corresponding to the specified film thickness of the flux 18 is provided in the surface of the first blade 21a to be brought into contact with the base member 17, while the second blade 21b is formed so as to make contact with the film-formation surface 17a.

Figure 7C:
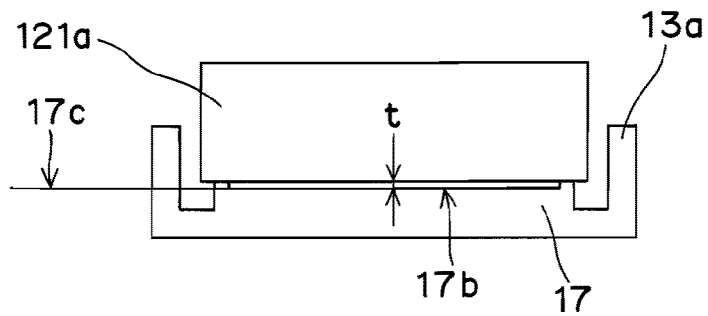
FIG. 7C is a configuration explanatory view of a film-formation use blade and a transfer table of a flux transfer unit according to a modification of the embodiment.
Figure 7D:
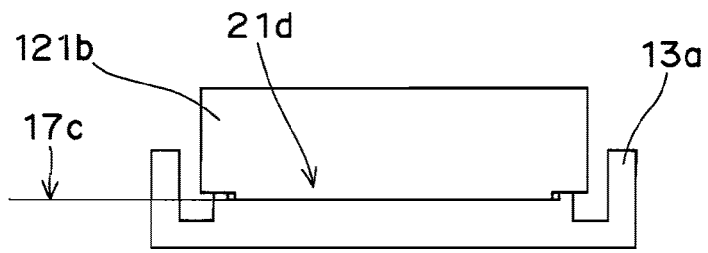
FIG. 7D is a configuration explanatory view of a scraping use blade and a transfer table of the flux transfer unit according to the modification of the embodiment.

In addition, as a construction for similarly forming a coating film of the flux 18 on the base member 17 and scraping the coating film of the flux 18, it is also possible to adopt such configurations of the blade and surface configurations of the base member 17 as shown in FIGS. 7C and 7D. That is, in the example shown in this case, a film-formation use first blade 121a having no cutout in the lower end portion is used, and a recessed portion 17b having a depth corresponding to the aforementioned film thickness t is provided in the film-formation surface 17a of the transfer table 13a, where a bottom face of the recessed portion 17b is used as a film-formation surface 17c. Then, by making the first blade 21a horizontally moved with the lower end portion of the first blade 121a kept in contact with the top face of the base member 17, a coating film of the flux 18 having the film thickness t is formed on the film-formation surface 17c.

In a second blade 121b is provided a protruding portion 21d which is fittable into the recessed portion 17b. By making the second blade 121b horizontally moved with the protruding portion 21d fitted into the recessed portion 17b so that the lower end portion is in contact with the film-formation surface 17c, the coating film of flux present on the film-formation surface 17c can be scraped off. That is, in the example shown in FIGS. 7C and 7D, the recessed portion 17b whose bottom face serves as the film-formation surface 17c and which has a depth corresponding to a specified film thickness of the flux coating film is provided in the top face of the base member 17, while the second blade 121b is formed so as to make contact with the bottom face of the recessed portion 17b.

Next, switching operation between the first blade 21a and the second blade 21b during the paste coating film formation and the paste scraping operation is described with reference to FIGS. 8A and 8B. In a stopped state in which the flux transfer unit 13 is doing no work, the swing link 27 stands erect as shown in FIG. 5 while the first blade 21a and the second blade 21b are both in a neutral state in which they are distant away from the film-formation surface 17a, in which state the flux 18 is stored in a space between the first blade 21a and the second blade 21b, i.e., in the flux storage portion.

Figure 8A:
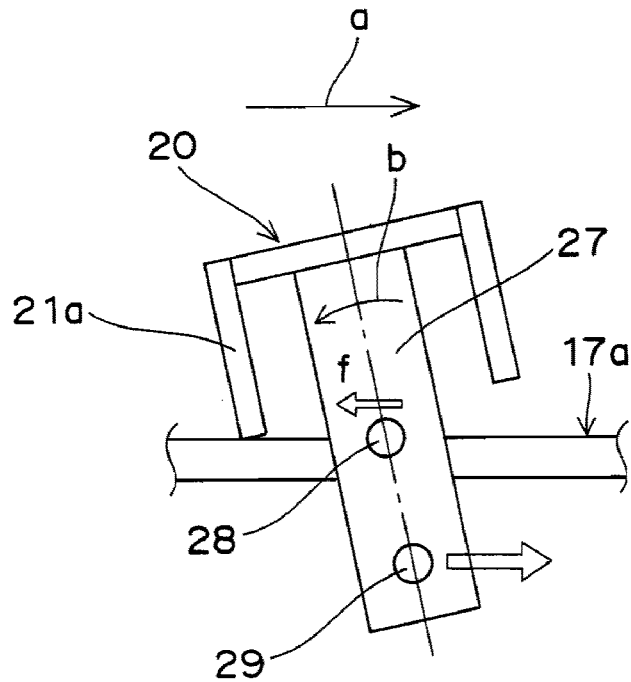
FIG. 8A is an operation explanatory view of a blade holding head of the flux transfer unit in the electronic component mounting apparatus of the embodiment, showing a film-formed state.

FIG. 8A shows a state in which a film-forming operation goes started in the above-described state. That is, the rodless cylinder 23 is driven to make the blade holding head 20 as a whole moved toward the film-forming direction (direction of arrow 'a'). When this occurs, the movable member 25 has been braked toward a direction opposite to the driving direction by the aforementioned braking mechanism, the braking force f in this case being set to one that overcomes the swinging resistance in swinging about the swing support pin 28. Therefore, as the driving force is transmitted with the drive transmission pin 29 used as the point of driving action, the swing link 27 first swings along a direction of arrow 'b' about the swing support pin 28. As a result, the lower end portion of the first blade 21a is brought into contact with the film-formation surface 17a. Further, the driving force is transmitted via the drive transmission pin 29, by which the whole blade holding head 20 is started to horizontally move along the direction of arrow 'a' with the first blade 21a kept in contact with the film-formation surface 17a.

Figure 8B:
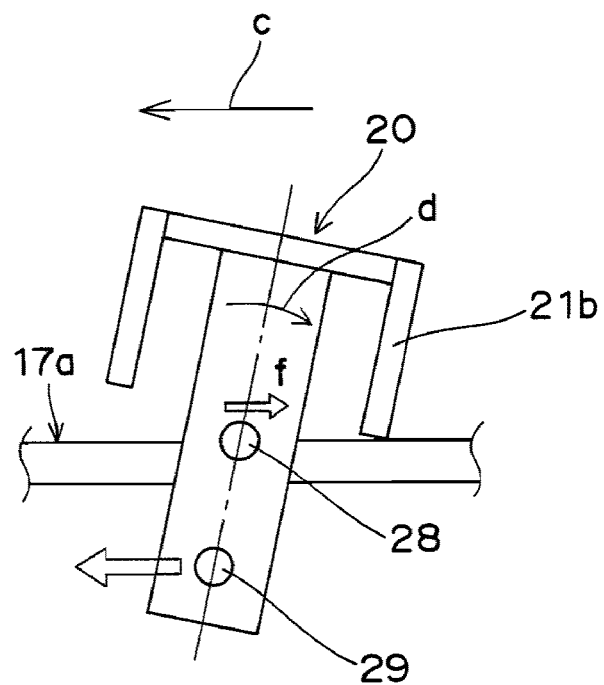
FIG. 8B is an operation explanatory view of the blade holding head of the flux transfer unit in the electronic component mounting apparatus of the embodiment, showing a scraped state.

FIG. 8B shows a state in which a scraping operation is started in a state that the blade holding head 20 has moved up to the motion end with the above-described film-forming operation completed. That is, the rodless cylinder 23 is driven in the reverse direction, by which the blade holding head 20 as a whole is moved toward the scraping direction (direction of arrow 'c'). When this occurs, by the action of the aforementioned braking mechanism, the swing link 27 first swings along a direction of arrow 'd' about the swing support pin 28. As a result, the lower end portion of the second blade 21b is brought into contact with the film-formation surface 17a. Further, the driving force is transmitted via the drive transmission pin 29, by which the whole blade holding head 20 is started to horizontally move along the direction of arrow 'c' with the second blade 21b kept in contact with the film-formation surface 17a.

Thus, in the flux transfer unit 13 shown in this embodiment, which has a construction that the blade holding head 20 is reciprocated along with the movable member 25 with the rodless cylinder 23 used as the reciprocative driving source, either one of the first blade 21a and the second blade 21b is moved while being kept in contact with the base member 17 during the forward motion of the movable member 25, and the other blade is moved while being kept in contact with the base member 17 through the aforementioned blade switching operation during the backward motion. In addition, which one of the first blade 21a and the second blade 21b is assigned to the forward motion of the blade holding head 20 in its reciprocative motion may be selected arbitrarily, and moreover the set positions of the first blade 21a and the second blade 21b are also arbitrarily selectable. Optimum conditions are determined based on the specifications and form of the flux transfer unit in the design stage.

Figure 9:
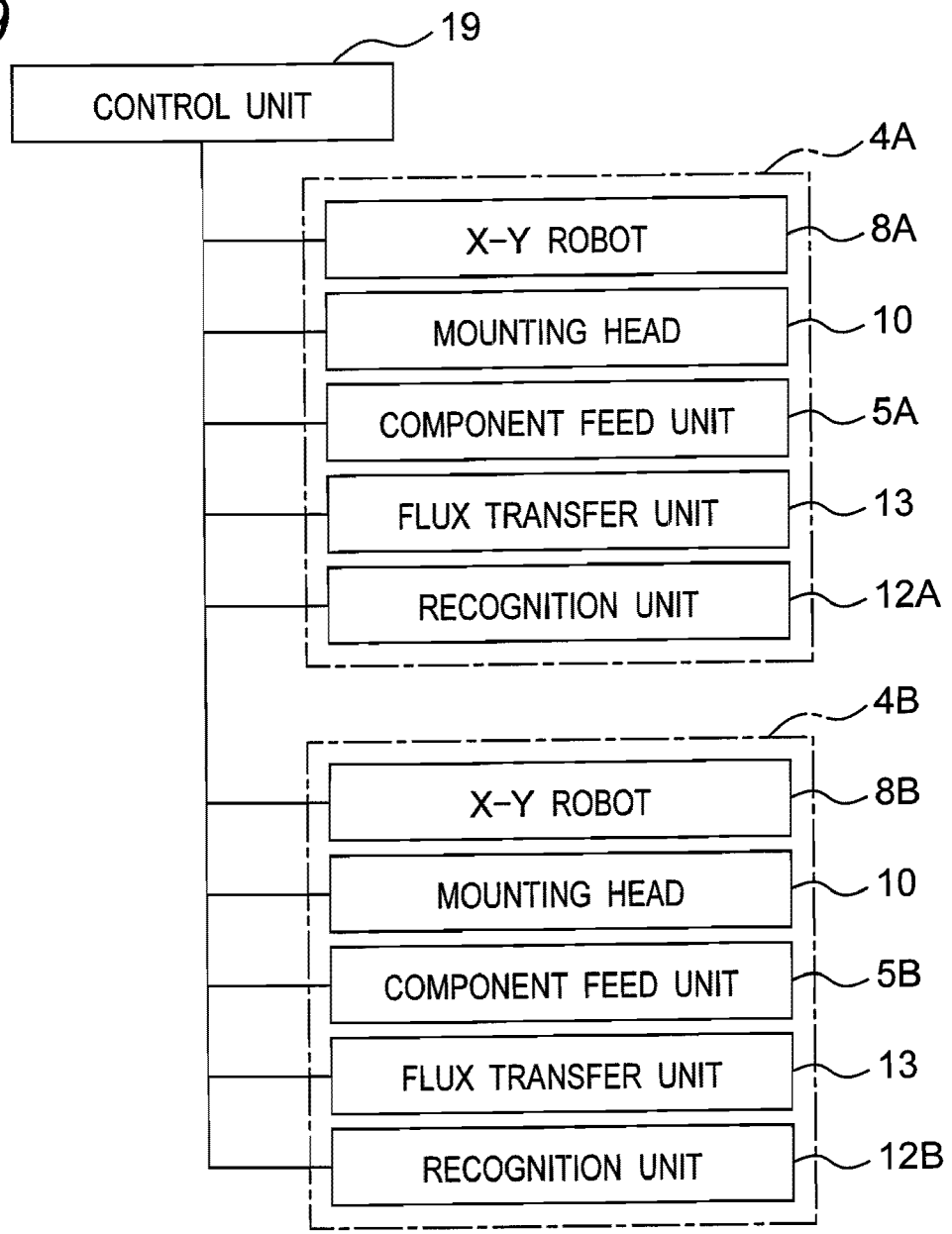
FIG. 9 is a block diagram showing a construction of a control system in the electronic component mounting apparatus of the embodiment.

Next, the configuration of the control system in the electronic component mounting apparatus shown in FIG. 9 is explained with reference to the block diagram of the control system. Referring to FIG. 9, a control unit 19 controls operations of individual component parts constituting the component mounting mechanisms 4A, 4B. That is, the control unit 19 controls the X-Y robots 8A, 8B, the mounting heads 10, the component feed units 5A, 5B, the flux transfer unit 13, and the recognition units 12A, 12B. In this case, the X-Y robots 8A, 8B are controlled based on recognition results by the recognition units 12A, 12B, by which positional shifts of electronic components are corrected.

Figure 10A:
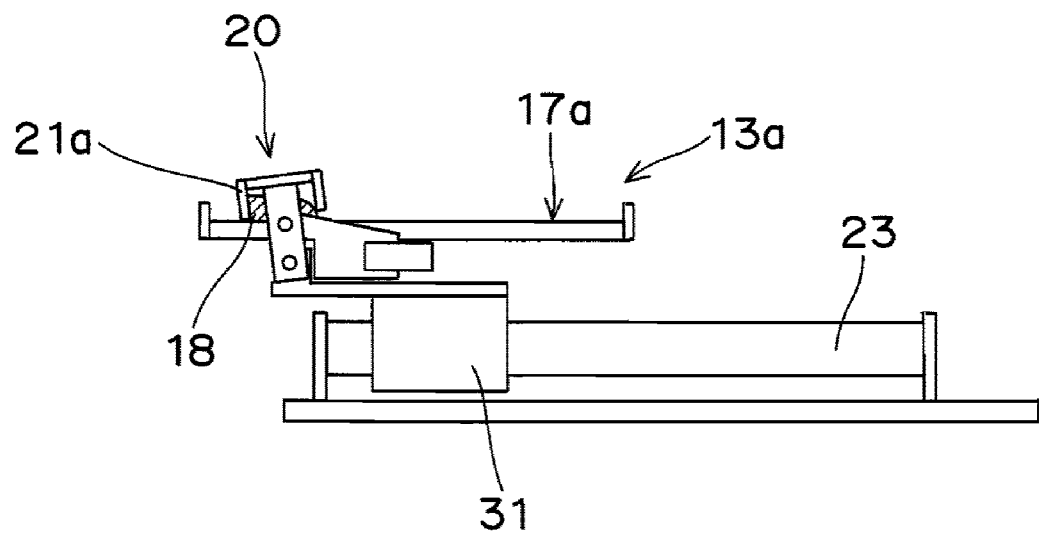
FIG. 10A is an operation explanatory view of the flux transfer unit in the electronic component mounting apparatus of the embodiment.
Figure 10B:
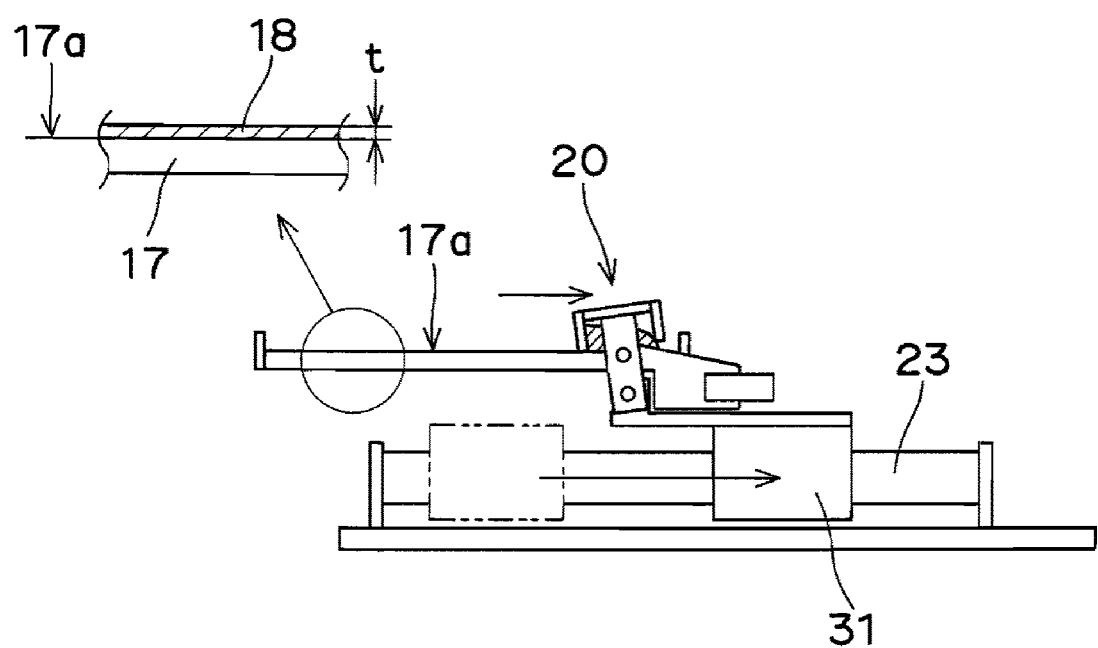
FIG. 10B is an operation explanatory view of the flux transfer unit in the electronic component mounting apparatus of the embodiment.

Next, operation of the flux transfer unit 13 is explained with reference to the schematic explanatory views shown in FIGS. 10A, 10B, 11A, 11B, 12A and 12B. FIG. 10A shows a state shown in FIG. 8A, i.e., a state that the first blade 21a is in contact with the film-formation surface 17a, so that the film-forming operation is enabled. Then, in this state, the rodless cylinder 23 is driven so that the whole blade holding head 20 is moved along with the movable block 31 toward the film-forming operation direction as shown in FIG. 10B, by which a coating film of the flux 18 having a specified film thickness t is formed by the first blade 21a on the film-formation surface 17a.

Figure 11A:
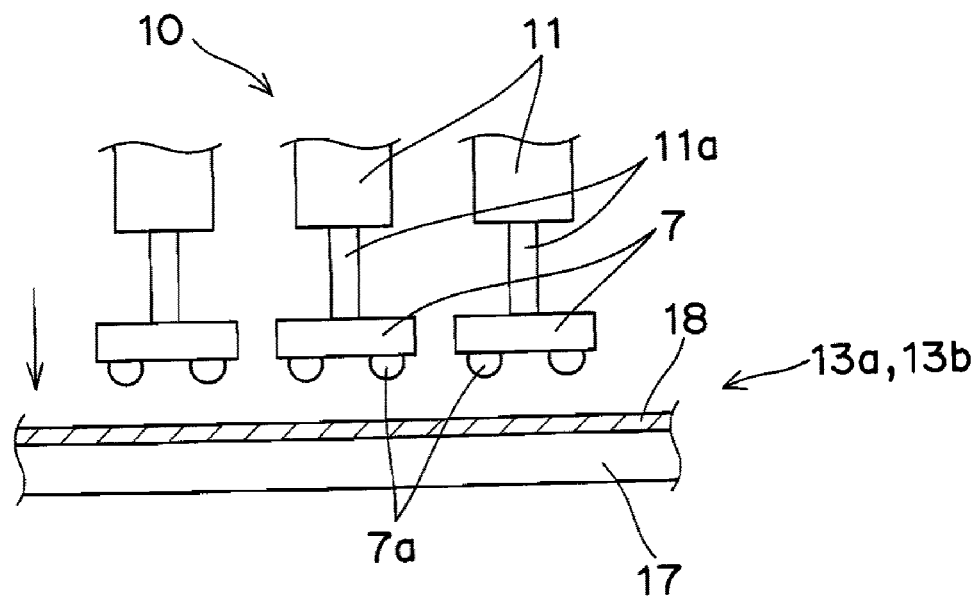
FIG. 11A is an operation explanatory view of the flux transfer unit in the electronic component mounting apparatus of the embodiment, showing a state immediately before paste transfer.
Figure 11B:
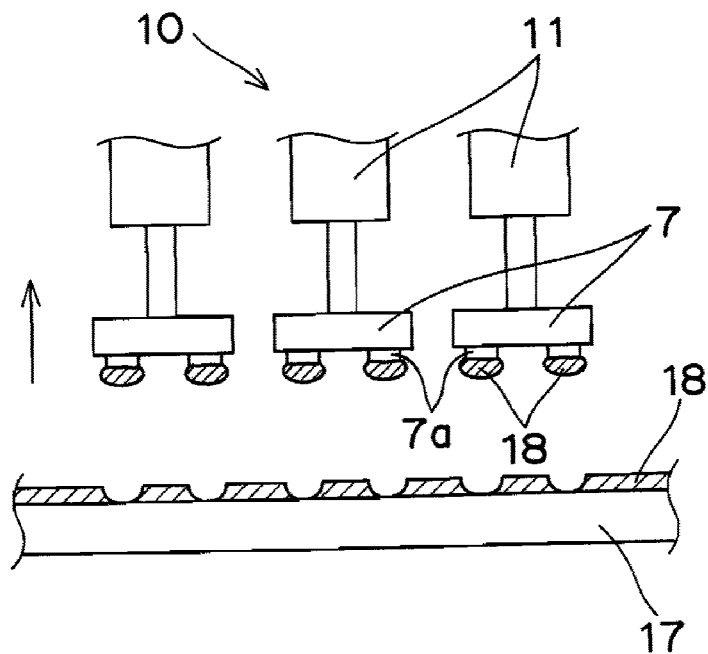
FIG. 11B is an operation explanatory view of the flux transfer unit in the electronic component mounting apparatus of the embodiment, showing a state immediately after paste transfer.

Next, flux transfer operation is executed. That is, as shown in FIG. 11A, the mounting head 10 having electronic components 7 held by the suction nozzles 11a of the suction nozzle units 11 is moved upward of the transfer table 13a or the transfer table 13b in which a coating film has preparatorily been formed on the base member 17. Then, the suction nozzle units 11 are made to perform up-and-down operations, making the electronic components 7 moved down to the base member 17, so that the bumps 7a formed on the lower face of the electronic components 7 are brought into contact with the flux 18. Subsequently, the suction nozzle units 11 are moved up, by which a specified amount of flux 18 is fed by transfer to the lower face side of the bumps 7a of the electronic components 7. This transfer operation causes the coating film of the flux 18 on the base member 17 to be roughened at its surface, making it difficult to correctly fulfill the subsequent transfer operation without any measures. Therefore, the scraping operation for the flux 18 is executed.

Figure 12A:
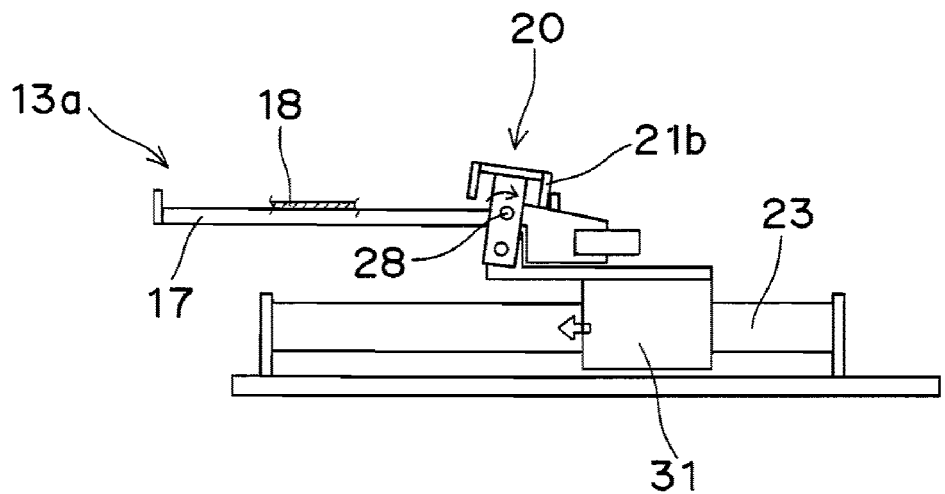
FIG. 12A is an operation explanatory view of the flux transfer unit in the electronic component mounting apparatus of the embodiment.
Figure 12B:
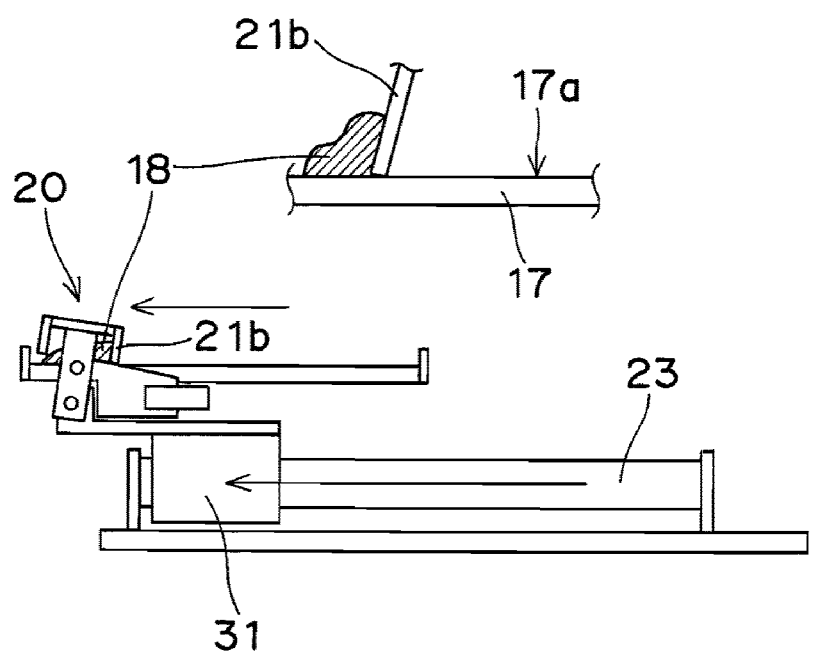
FIG. 12B is an operation explanatory view of the flux transfer unit in the electronic component mounting apparatus of the embodiment.

That is, as shown in FIG. 12A, the driving direction of the rodless cylinder 23 is reversed, by which the blade holding head 20 comes to a state shown in FIG. 8B, i.e., a state that the second blade 21b is in contact with the film-formation surface 17a, enabling the scraping operation. Then, in this state, the rodless cylinder 23 is driven to make the whole blade holding head 20 moved along with the movable block 31 along the scraping operation direction as shown in FIG. 12B, by which the flux 18 on the film-formation surface 17a is scraped off by the second blade 21b, thus a new film-forming operation being enabled.

As described hereinabove, according to the present invention, in an apparatus in which film formation operation and scraping operation of paste are performed alternately by two blades, the apparatus adopts a method that switching between the two blades is executed by using driving force of the reciprocating mechanism for horizontally moving the blades. With adoption of the arrangement shown above, a simplified-in-mechanism, more compact device can be realized without requiring such a blade switching mechanism having an additional driving source as those used in the prior art. Also, the transfer tables 13a, 13b each having a smooth film-formation surface 17a which is so sized as to allow simultaneous, collective transfer to a plurality of suction nozzles 11a set on the mounting heads 10 are provided in correspondence to the mounting heads 10, respectively. Therefore, it becomes practicable to fulfill high-efficiency, high-accuracy transfer and application of a specified amount of flux to the bumps 7a of the electronic components 7.

Thus, according to this embodiment, high-accuracy application of flux or other paste by transfer becomes achievable with a compact device. In addition, although the embodiment has been described on a case where the paste to be transferred is exemplified by flux, the object to be applied by transfer may be pasty viscous materials other than flux such as solder paste and resin adhesive.

The electronic component mounting apparatus of the present invention has an effect that high-accuracy application of flux or other paste can be achieved with a compact device, hence useful for use in applying paste by transfer to electronic components held by mounting heads and then mounting the electronic components onto boards.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosure of Japanese Patent Application No. 2006-070616 filed on Mar. 15, 2006, including specification, drawings and claims for patent, are incorporated herein by reference in its entirety.

The invention claimed is:

1. A paste transfer device for transferring paste to an electronic component, comprising:
   a base member having a smooth film-formation surface on a top face thereof on which a paste film to be put into contact with the electronic component is formed;
   a movable member for moving horizontally along the base member;
   a blade holder which is coupled to the movable member coupled to a rail position under the film-formation surface so as to be swingable about a swinging fulcrum, for reciprocating along with the movable member;
   a first blade and a second blade which are provided in the blade holder so as to be spaced from each other along a direction of the reciprocative motion so that a position of the swinging fulcrum in the direction of the reciprocative motion is placed therebetween;
   a reciprocating mechanism for transmitting reciprocative driving force on a point of driving action where is given by a position in the blade holder distant from the swinging fulcrum; and
   a braking mechanism for braking the movable member toward a direction opposite to a direction of drive by the reciprocating mechanism with a braking resistance which overcomes a swinging resistance in a swinging of the blade holder, wherein
   either one of the first blade and the second blade is moved while being kept in contact with the base member during a forward motion of the movable member, and the other blade is moved while being kept in contact with the base member during a backward motion of the movable member.

2. The paste transfer device as defined in claim 1, wherein
   the first blade is a film-formation use blade for forming a paste film having a predetermined film thickness on the film-formation surface, and
   the second blade is a scraping use blade for scraping paste present on the film-formation surface.

3. The paste transfer device as defined in claim 2, wherein
   a cutout portion having a depth corresponding to the film thickness is provided at a contact portion of the film-forming use blade with the base member, and
   the scraping use blade is formed so as to make contact with the film-formation surface of the base member.

4. The paste transfer device as defined in claim 2, wherein a recessed portion whose bottom face functions as the film-formation surface and which has a depth corresponding to the film thickness is provided on the top face of the base member, and the scraping use blade is formed so as to make contact with the bottom face of the recessed portion.

5. The paste transfer device as defined in claim 1, wherein a paste storage portion for storing therein paste scraped off from the film-formation surface is provided between the first blade and the second blade.

6. An electronic component mounting apparatus comprising:
   a mounting head for holding and mounting the electronic component onto a board;
   a board holding unit for holding the board;
   a head moving device for moving and positioning the mounting head relative to the board holding unit; and
   te transfer device, as defined in claim 1, which is placed on a moving path of the mounting head to be moved by the head moving device, and which transfers paste to the electronic component held by the mounting head.

* * * * *